(12) United States Patent
Igarashi (10) Patent No.: US 11,756,714 B2
(45) Date of Patent: Sep. 12, 2023

(54) COMPOSITE MAGNETIC MATERIAL AND METHOD FOR MANUFACTURING SAME

(71) Applicant: TOKIN CORPORATION, Sendai (JP)

(72) Inventor: Toshiyuki Igarashi, Sendai (JP)

(73) Assignee: TOKIN CORPORATION, Miyagi (JP)

( * ) Notice: Subject to any disclaimer, the term of this patent is extended or adjusted under 35 U.S.C. 154(b) by 984 days.

(21) Appl. No.: 16/074,424

(22) PCT Filed: Apr. 28, 2016

(86) PCT No.: PCT/JP2016/063345
§ 371 (c)(1),
(2) Date: Jul. 31, 2018

(87) PCT Pub. No.: WO2017/138158
PCT Pub. Date: Aug. 17, 2017

(65) Prior Publication Data
US 2019/0035525 A1    Jan. 31, 2019

(30) Foreign Application Priority Data

Feb. 10, 2016    (JP) .................................. 2016-023273

(51) Int. Cl.
*H01F 1/24*    (2006.01)
*H01F 1/26*    (2006.01)
(Continued)

(52) U.S. Cl.
CPC ................ *H01F 1/24* (2013.01); *B22F 1/052* (2022.01); *B22F 1/068* (2022.01); *B22F 1/102* (2022.01);
(Continued)

(58) Field of Classification Search
CPC ... H01F 1/147; H01F 1/24; H01F 1/26; H01F 1/28; H01F 41/0246; B22F 1/0007;
(Continued)

(56) References Cited

U.S. PATENT DOCUMENTS 3,568,554 A * 3/1971 Wiechec ............. H01F 41/0246
83/98
6,102,980 A * 8/2000 Endo ........................ H01F 1/24
148/102

(Continued)

FOREIGN PATENT DOCUMENTS

CN    103650074 A    3/2014
CN    103765529 A    4/2014
(Continued)

OTHER PUBLICATIONS

Machine translation of JPH1092621A, 7 pages. (Year: 1998).*
(Continued)

*Primary Examiner* — Matthew E. Hoban
*Assistant Examiner* — Lynne Edmondson
(74) *Attorney, Agent, or Firm* — Holtz, Holtz & Volek PC (57) ABSTRACT

Provided is a composite magnetic material in which low electrical conductivity and high magnetic permeability are achieved, and in which a frequency band in which decoupling is caused encompasses higher frequencies. The composite magnetic material comprises a flat soft magnetic metal powder; insulating particles which are smaller than an average thickness of the soft magnetic metal powder and which are disposed on a surface of the soft magnetic metal powder; and an organic binder material which retains the soft magnetic metal powder and the insulating particles in a dispersed manner. In a cross section in a thickness direction of the soft magnetic metal powder, there is at least one insulating particle per a length of 0.2 μm of the soft magnetic metal powder surface.

5 Claims, 6 Drawing Sheets

(51) Int. Cl.
- *H01F 1/28* (2006.01)
- *H05K 9/00* (2006.01)
- *B22F 1/16* (2022.01)
- *B22F 1/052* (2022.01)
- *B22F 1/068* (2022.01)
- *B22F 1/103* (2022.01)
- *B22F 1/102* (2022.01)
- *H01F 1/147* (2006.01)
- *H01F 41/02* (2006.01)

(52) U.S. Cl.
CPC ............. *B22F 1/103* (2022.01); *B22F 1/16* (2022.01); *H01F 1/147* (2013.01); *H01F 41/0246* (2013.01); *H05K 9/0075* (2013.01); *H01F 1/26* (2013.01)

(58) Field of Classification Search
CPC ........ B22F 1/0014; B22F 1/0055; B22F 1/02; B22F 2001/0066; H05K 9/0075; B29C 70/025
USPC .......... 252/62.54, 62.55; 427/419.2; 428/900
See application file for complete search history.

(56) References Cited

U.S. PATENT DOCUMENTS

| | | | |
|---|---|---|---|
| 2002/0097124 A1 | 7/2002 | Inoue et al. | |
| 2002/0198286 A1* | 12/2002 | Igarashi | H01L 23/552 523/137 |
| 2014/0104031 A1 | 4/2014 | Ogawa et al. | |
| 2014/0191835 A1 | 7/2014 | Ogawa et al. | |
| 2014/0225703 A1 | 8/2014 | Otake et al. | |
| 2016/0044838 A1 | 2/2016 | Aga et al. | |

FOREIGN PATENT DOCUMENTS

| | | |
|---|---|---|
| JP | H1092621 A | 4/1998 |
| JP | H10335128 A | 12/1998 |
| JP | 2006049729 A | 2/2006 |
| JP | 2009158652 A | 7/2009 |
| JP | 2010080508 A | 4/2010 |
| JP | 2014199862 A | 10/2014 |
| TW | 492020 B | 6/2002 |

OTHER PUBLICATIONS

Gomez-Tena et al., "Relationship Between the Specific Surface Area Parameters Determined Using Different Analytical Techniques", Qualicer 14, pp. 1-10. (Year: 2014).*

International Search Report (ISR) dated Jul. 26, 2016 issued in International Application No. PCT/JP2016/063345.

Written Opinion dated Jul. 26, 2016 issued in International Application No. PCT/JP2016/063345.

Chinese Office Action (and English language translation thereof) dated Jun. 25, 2019 issued in counterpart Chinese Application No. 201680081129.7.

* cited by examiner

COMPOSITE MAGNETIC MATERIAL AND METHOD FOR MANUFACTURING SAME

TECHNICAL FIELD

This invention relates to a composite magnetic material to be used for suppression of electromagnetic noise, and more specifically, to a composite magnetic material obtained by dispersing, in an organic binder, composite magnetic powder in which insulating particles are distributed on a surface of soft magnetic metal powder having a flat shape and by forming the resultant.

BACKGROUND ART

Along with downsizing and speeding-up of electronic devices, there is a problem in that electromagnetic noise generated from a high frequency circuit causes electromagnetic interference in the electronic devices, such as a malfunction or interference. In recent years, for the purpose of preventing the electromagnetic interference, there has been used an electromagnetic interference suppressing body utilizing a magnetic loss of a magnetic material, that is, a composite magnetic material obtained by dispersing soft magnetic powder in a non-magnetic binder and forming the resultant into a thin sheet shape.

In Patent Document 1, there is described a composite magnetic material consisting essentially of soft magnetic powder having a flat shape and an organic binder, in which the soft magnetic powder having a flat shape is subjected to coating treatment with fine powder for surface modification.

In addition, as an example of magnetic powder to be used for the composite magnetic material, in Patent Document 2, there is described composite magnetic powder for noise suppression in which metal powder is coated with fine particles each having a high dielectric constant and a binder resin.

PRIOR ART DOCUMENTS

Patent Document

Patent Document 1: JP H10-92621 A
Patent Document 2: JP 2014-199862 A
Patent Document 3: JP H10-335128 A

SUMMARY OF THE INVENTION

Problem to be Solved by the Invention

A reduction in electrical conductivity of the composite magnetic material contributes to a reduction in production cost of the electronic device because, at the time of mounting on the electronic device, insulation treatment from an electronic component arranged close to the composite magnetic material owing to downsizing can be omitted.

In addition, a reduction in electrical conductivity of the composite magnetic material is desired also from the viewpoint of prevention of the electromagnetic interference. When the electrical conductivity of the composite magnetic material is increased, a conductive path is generated in the composite magnetic material. Thus, a dielectric component $\varepsilon'$ of a dielectric constant diverges, and also a value for a conductive component $\varepsilon'$ is increased, with the result that the electrical conductivity $\sigma$ $(=\varepsilon''2\pi f$, where f represents frequency) of the composite magnetic material at high frequency is also increased. Accordingly, reflection of an unnecessary electromagnetic wave is increased, and in addition, LC resonance in association with the dielectric component $\varepsilon'$ shifts to a low frequency side. As a result, high frequency response of decoupling from a noise source is deteriorated. In order to improve such decoupling, the inventor of this invention has found that the magnetic permeability and the electrical conductivity of the composite magnetic material need to be appropriately set.

In general, in order to improve the decoupling, it is considered that an increase in magnetic permeability is required. When the composite magnetic material is formed only of soft magnetic metal powder and an organic binder, the organic binder needs to be blended in an amount sufficient for coating the respective soft magnetic metal powders in order to reduce the electrical conductivity, and hence it becomes difficult to increase the packing density of the soft magnetic metal powder in the composite magnetic material. Accordingly, a considerable thickness is required for achieving a function as the composite magnetic material. Thus, a distance between the respective soft magnetic metal powders is increased, and their magnetic bonding is weakened, with the result that the magnetic permeability of the composite magnetic material is reduced.

In addition, in order to improve the decoupling, it is considered that a reduction in electrical conductivity is required. When the packing density of the soft magnetic metal powder in the composite magnetic material is increased by increasing a blending ratio thereof, a reduction in magnetic permeability of the composite magnetic material can be prevented, but the ratio of the organic binder is relatively reduced to increase the electrical conductivity, and there is a problem in that a noise suppression effect in a high frequency region is reduced. In order to satisfy such trade-off conditions in relation to decoupling, a configuration as in Patent Document 1 in which the soft magnetic metal powder in itself is subjected to insulation treatment is effective, and as an example of such insulation treatment on metal powder, methods described in Patent Document 2 and Patent Document 3 have been proposed.

When, for example, fine particle coating by a thermal plasma method described in Patent Document 1 is used as a method of forming the fine powder for surface modification on the soft magnetic powder, there is a problem of an increase in production cost owing to the necessity for a special production facility or operation step. In addition, it is difficult to uniformly form the fine powder for surface modification on the surface of the soft magnetic powder through the fine particle coating by the thermal plasma method, and there is another problem in that insulation properties become insufficient. Specifically, when the coating by the thermal plasma method in Patent Document 1 is applied onto powder serving as an aggregate of particles, there are problems in that one surface of a particle present on the surface of the powder is coated with the fine powder for surface modification, but another back surface thereof is not coated, and further, a particle inside the powder is not coated.

In addition, in a technology described in Patent Document 2, fine particle coating can be achieved by stirring the soft magnetic powder, the fine particles each having a high dielectric constant, and the binder resin with a milling device, and the method of Patent Document 2 is simpler and offers lower cost than the method of Patent Document 1. However, as described above, a configuration in which the soft magnetic powder is uniformly coated with the binder resin has a problem in that a distance between the respective soft magnetic powders is increased and the magnetic permeability of the composite magnetic material is reduced. Besides, there is no disclosure of a method of forming the powder in which the binder resin has already been cured on a surface thereof into a composite magnetic material having a sheet shape or the like, and there is a problem in that production of such tangible composite magnetic material is impossible or difficult.

In addition, in a technology described in Patent Document 3, coating is applied onto ferromagnetic metal powder by mixing the ferromagnetic metal powder with a titanium oxide sol or a zirconium oxide sol, and the method of Patent Document 3 is simpler and offers lower cost than the method of Patent Document 1. However, in the technology described in Patent Document 3, as described in paragraph [0020], it is not easy to cause oxide particles to adhere to the surface of the ferromagnetic metal powder so as to uniformly coat the surface without addition of a heat resistant resin, and there is a problem in that insulation properties become insufficient. In addition, in a configuration in which the heat resistant resin is added, the heat resistant resin intermediates between the ferromagnetic metal powder and the oxide particles to no small extent, and hence it becomes difficult for the oxide particles to be brought into close contact with the surface of the ferromagnetic metal powder, resulting in a problem in that the insulation properties are reduced.

This invention has been made to solve the above-mentioned problems of the related art, and an object of this invention is to provide a composite magnetic material which achieves both a low electrical conductivity and a high magnetic permeability, which are appropriately set, and allows a frequency band in which decoupling occurs to cover higher frequency.

Means to Solve the Problem

According to this invention, the above-mentioned problem is solved by a composite magnetic material, comprising soft magnetic metal powder having a flat shape; insulating particles distributed on a surface of the soft magnetic metal powder, the insulating particles each having a size smaller than an average thickness of the soft magnetic metal powder; and an organic binder configured to retain the soft magnetic metal powder and the insulating particles in a dispersed manner, wherein the insulating particles are distributed so that a number of the insulating particles is one or more per a length of 0.2 µm of the surface of the soft magnetic metal powder in a cross section of the soft magnetic metal powder in a thickness direction.

In the composite magnetic material according to the present invention, the soft magnetic metal powder preferably has a 10% cumulative particle diameter $D_{10}$ of 2 µm or more and 6 µm or less and a 90% cumulative particle diameter $D_{90}$ of 8 µm or more and 27 µm or less in a volume-based particle size distribution.

In the composite magnetic material according to the present invention, each of the insulating particles preferably comprises at least one kind of alumina, silica, magnesia, titania, or zirconia.

In the composite magnetic material according to the present invention, each of the insulating particles preferably has a volume resistivity of $1 \times 10^{13}$ Ω·cm or more.

In the composite magnetic material according to the present invention, the insulating particles preferably have a median diameter $D_{50}$ of 10 nm or more and 70 nm or less in a volume-based particle size distribution.

A method of producing a composite magnetic material according to the present invention is characterized by comprising immersing said soft magnetic metal powder in a sol which is obtained by dispersing said insulating particles in an aqueous solvent and has a pH of more than 7.0, followed by drying the aqueous solvent to coat a surface of the soft magnetic metal powder with the insulating particles; kneading the soft magnetic metal powder with an organic binder to cause the soft magnetic metal powder to be dispersed therein; and forming the resultant into a sheet shape.

In the composite magnetic material to be used for suppression of noise, as a distance between the respective soft magnetic metal powders each having a flat shape, particularly a distance between the powders in a thickness direction is shortened more, their magnetic bonding is strengthened more, and a magnetic permeability is increased more. As the magnetic permeability is increased more, a loss component µ" required for suppression of electromagnetic noise is improved more.

Meanwhile, as an electrical conductivity between the respective soft magnetic metal powders is reduced more, a dielectric constant is reduced more, and frequency response of decoupling in a high frequency region is improved more. Accordingly, in view of the characteristics of the composite magnetic material, it is preferred to form a thin insulating coating on the surface of the soft magnetic metal powder to reduce the electrical conductivity.

However, in the composite magnetic material, a case in which a blending ratio of the organic binder is increased or an insulating coating is formed on the soft magnetic metal powder through coating with a binder resin is not preferred because the distance between the respective soft magnetic metal powders is increased and the magnetic permeability of the composite magnetic material is reduced.

In addition, when the insulating coating is formed on the soft magnetic metal powder by a thermal plasma method or the like, it is difficult to reduce production cost, and hence application to a composite magnetic material for inexpensive electronic device applications is difficult.

In the composite magnetic material according to the embodiment of this invention, the insulating particles each having a size smaller than the average thickness of the soft magnetic metal powder having a flat shape are distributed on the surface of the soft magnetic metal powder, the respective soft magnetic metal powders are retained in the organic binder in a dispersed manner, and the insulating particles are distributed so that the number of the insulating particles is one or more per a length of 0.2 µm of the surface of the soft magnetic metal powder in a cross section of the soft magnetic metal powder in a thickness direction, that is, the insulating particles are uniformly distributed on the surfaces of all soft magnetic metal particles constituting the soft magnetic metal powder. With this, the respective soft magnetic metal powders are separated from each other through the insulating particles to have high insulating properties. In addition, the organic binder can be used in only the amount required for retaining the soft magnetic metal powder in a dispersed manner, and hence the distance between the respective soft magnetic metal powders can be reduced. This invention does not exclude a composite magnetic material produced by partially mixing the soft magnetic metal powder with another soft magnetic metal powder prevented from being coated with insulating particles.

In addition, in order to form the insulating particles on the surface of the soft magnetic metal powder, a method involving immersing the soft magnetic metal powder in a sol obtained by dispersing the insulating particles in an aqueous solvent, followed by drying, is suitable because such method is suitable for particles each having a small size, enables uniform coating on the surface of the soft magnetic metal powder, and offers low production cost. The sol only needs to have an alkaline pH of more than 7.0 so that the soft magnetic metal powder is not corroded. When the sol has a weak alkaline pH, the soft magnetic metal powder has a cationic surface, and hence the insulating particles are bonded to the surface of the soft magnetic metal powder by an electrical force only by mixing the sol and the soft magnetic metal powder with each other. When the dispersibility of the insulating particles and the adhesion properties of the insulating particles to the surface of the metal powder in the sol, and the adhesiveness of the insulating particles to the organic binder are reduced, the pH may be confined to a weak alkaline range of more than 7.0 and 8.2 or less.

The composite magnetic material according to the embodiment of the present invention can be obtained by kneading the soft magnetic metal powder coated with the insulating particles with the organic binder so that the soft magnetic metal powder is dispersed therein, and forming the resultant into a sheet shape.

Effect of the Invention

According to this invention, the composite magnetic material which achieves both a low electrical conductivity and a high magnetic permeability, and allows a frequency band in which decoupling occurs to cover higher frequency can be provided.

BRIEF DESCRIPTION OF THE DRAWING

FIGS. 2A-2D include SEM observation photographs of soft magnetic metal powder coated with insulating particles in a composite magnetic material according to this invention.

FIGS. 3A and 3B include graphs for showing frequency response of a dielectric constant of a composite magnetic material.

FIGS. 5A and 5B include schematic views for illustrating an application example of the composite magnetic material of Example 1 or Comparative Example 1.

MODES FOR EMBODYING THE INVENTION

Now, an embodiment of this invention is described in detail.

Embodiment

Figure 1:
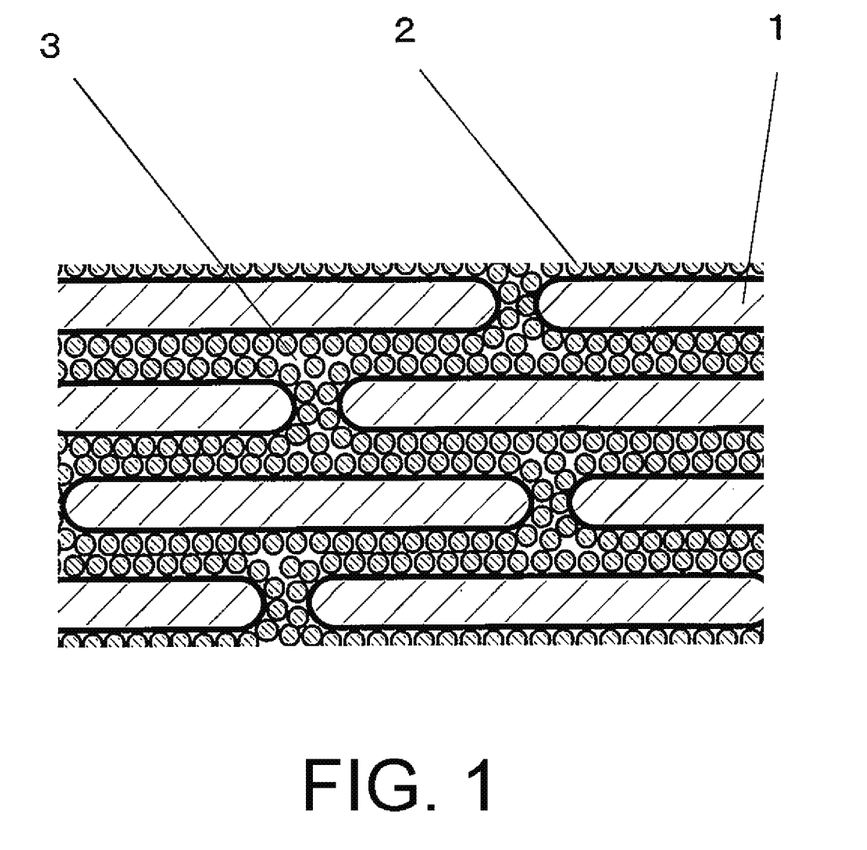
FIG. 1 is a schematic view for illustrating a sectional structure of a composite magnetic material according to this invention.

FIG. 1 is a schematic view for illustrating a sectional structure of a composite magnetic material according to this invention. As illustrated in FIG. 1, a composite magnetic material according to an embodiment of this invention has the following configuration: the composite magnetic material includes: soft magnetic metal powder 1 having a flat shape; insulating particles 2 distributed on the surface of the soft magnetic metal powder, the insulating particles 2 each having a size smaller than the average thickness of the soft magnetic metal powder; and an organic binder 3 configured to retain the soft magnetic metal powder 1 and the insulating particles 2 in a dispersed manner.

In order to reduce the electrical conductivity of the composite magnetic material, the insulating particles 2 are distributed between layers of the soft magnetic metal powders 1 so that the number of the insulating particles 2 is one or more per a length of 0.2 μm of the surface of the soft magnetic metal powder 1 in a cross section of the soft magnetic metal powder 1 in a thickness direction, to thereby achieve desired characteristics. FIGS. 2A-2D are SEM observation photographs of the soft magnetic metal powder 1 of this invention. The surface of the soft magnetic metal powder 1 is almost completely coated with the insulating particles 2.

With regard to the soft magnetic metal powder, for example, in order to obtain a large magnetic loss μ" in a frequency band of 1 GHz or more, magnetic resonance frequency needs to be extended and a large μ is required. Further, a material for the soft magnetic metal powder also needs to have such ductility as to enable its processing into powder having a flat shape. Therefore, it is preferred to use, as a soft magnetic metal material having a saturated magnetic flux density Bs of 1 T or more, Fe or an alloy thereof, specifically, Fe, Fe—Si, Fe—Al, Fe—Cr, Fe—Si—Al, or the like.

The material for the soft magnetic metal powder may appropriately be selected and used in combination depending on magnetic characteristics to be required and a target frequency band. For example, a Ni-based alloy having a lower saturated magnetic flux density than an Fe-based alloy, such as Ni—Fe, may be used.

With regard to the particle diameter of the soft magnetic metal powder, in order to achieve the magnetic characteristics to be required without reducing the density of the soft magnetic metal powder in the composite magnetic material, the soft magnetic metal powder preferably has a 10% cumulative particle diameter $D_{10}$ of 2 μm or more and 6 μm or less and a 90% cumulative particle diameter $D_{90}$ of 8 μm or more and 27 μm or less in a volume-based particle size distribution.

It is required for the insulating particles to have high volume resistivity and maintain a distance between the particles of the soft magnetic metal powder without being deformed even through pressurization at the time of forming, and hence an oxide-based insulating material is suitable. In particular, alumina, silica, magnesia, titania, zirconia, or a material including at least one kind thereof is suitable for the composite magnetic material of this invention. Those materials are more suitable when having a volume resistivity of $1 \times 10^{13}$ Ω·m or more and having a median diameter $D_{50}$ of 10 nm or more and 70 nm or less in a volume-based particle size distribution. When the $D_{50}$ is less than 10 nm, insulation properties between the soft magnetic metal powders become insufficient, and the electrical conductivity of the composite magnetic material is increased. In addition, when the $D_{50}$ is more than 70 nm, the distance between the soft magnetic metal powders is increased to 140 nm or more, and their magnetic bonding is weakened, with the result that the magnetic permeability of the composite magnetic material is reduced.

As a method of forming the insulating particles on the surface of the soft magnetic metal powder, a method involving immersing the soft magnetic metal powder in a sol which is obtained by dispersing the insulating particles in an aqueous solvent and has a pH of more than 7.0, more preferably a pH of more than 7.0 and 8.2 or less, which is a weak alkaline pH, followed by heating to dryness, is preferred. When the specific surface area of the soft magnetic metal powder having a flat shape and the specific surface area of each of the insulating particles are defined as Sp and Sz, respectively, and the number of laminated layers of the insulating particles is defined as n, the blending ratio of each component is adjusted so that the equation $(Sz/2)/Sp=n$ is established. In order to uniformly form the insulating particles on the surface of the soft magnetic metal powder, n is preferably set to 1 or more. In addition, when the number of laminated layers of the insulating particles is too large, the distance between the soft magnetic metal powders is increased, and their magnetic bonding is weakened, with the result that the magnetic permeability of the composite magnetic material is reduced. Therefore, n is preferably set to 2 or less.

As the organic binder, any material which is capable of dispersing and retaining the soft magnetic metal powder in which the insulating particles are distributed on the surface thereof, and has easy formability may be used with no particular limitation. For example, an acrylic rubber, a urethane resin, a silicone resin, or an epoxy resin may be used. In addition, when it is required to improve bonding properties between the soft magnetic metal powder and the organic binder or impart flame retardancy, any known coupling agent or flame retardant may be added.

When the soft magnetic metal powder in which the insulating particles are formed on the surface thereof is kneaded with the organic binder so that the soft magnetic metal powder is dispersed therein, and the resultant is formed into a sheet shape, the composite magnetic material of this invention is obtained.

EXAMPLES

Now, Example of this invention is described.

Example 1

The composite magnetic material according to the embodiment of this invention was produced through use of carbonyl iron powder as the soft magnetic metal powder and zirconia particles as the insulating particles.

Commercially available carbonyl iron powder was subjected to pulverization treatment with a wet-type attritor, and a slutty after the pulverization is dried in a vacuum drier, followed by classification with a mesh. Thus, soft magnetic metal powder having a flat shape having a specific surface area Sp of 2.2 m$^2$/g was obtained.

As the insulating particles, zirconia particles having a particle diameter $D_{50}$ of 12 nm and each having a specific surface area Sz of 41.7 m$^2$/g were mixed with a dispersant and water so as to achieve a solid content of 10 wt %, and the resultant was subjected to dispersion treatment with an ultrasonic disperser. Thus, a zirconia sol having a pH of 7.4 was obtained.

Figure 2A:
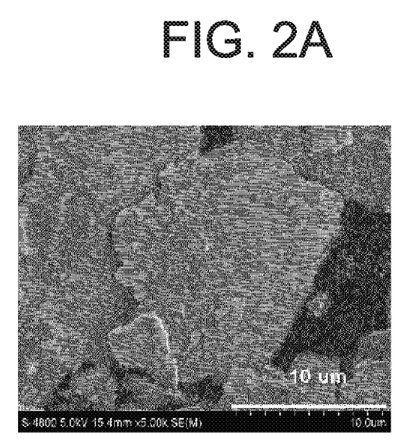
FIG. 2A is a photograph of soft magnetic metal powder coated with zirconia particles having a $D_{50}$ of 70 nm.
Figure 2B:
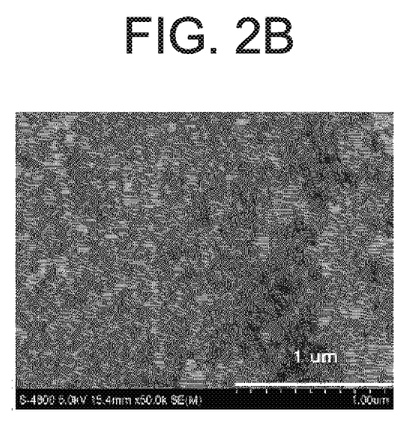
FIG. 2B is an enlarged photograph of a surface shown in FIG. 2A.
Figure 2C:
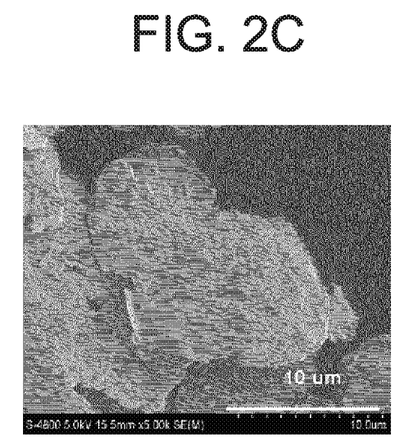
FIG. 2C is a photograph of soft magnetic metal powder coated with zirconia particles having a $D_{50}$ of 12 nm.
Figure 2D:
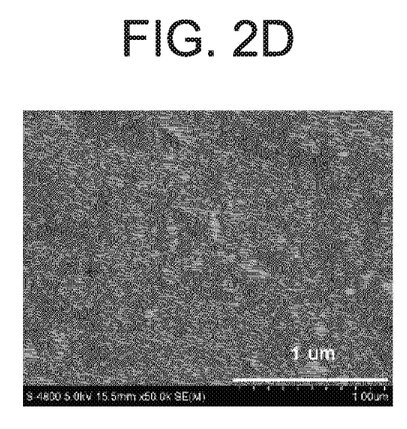
FIG. 2D is an enlarged photograph of a surface shown in FIG. 2C.

The addition amount of the zirconia sol was determined so that one layer of zirconia nanoparticles was formed on the surface of one particle of the soft magnetic metal powder having a flat shape, that is, the equation $(Sz/2)/Sp=1$ was established. The zirconia sol in the determined amount and the soft magnetic metal powder were mixed with each other, and then, the mixture was dried in an oven in the atmosphere. Thus, the soft magnetic metal powder whose surface was coated with the zirconia particles was obtained. As shown in FIGS. 2C and 2D, from scanning electron microscope (SEM) images of a composite magnetic material to be obtained, it was able to be confirmed that the zirconia particles were almost uniformly fixed to the surface of the soft magnetic metal powder.

50 vol % of the flat carbonyl iron powder coated with the zirconia nanoparticles, 40 vol % of an acrylic rubber, and 10 vol % of a silane coupling agent were blended, and mixed with a planetary centrifugal mixer AR-100 (manufactured by THINKY Corporation) for 12 minutes to produce an application liquid.

The application liquid was applied onto an polyester sheet and formed into a film with a baker applicator, and was dried to produce a green sheet. Next, the green sheets each having formed into a film were laminated on one another and subjected to thermal pressure bonding. Thus, a composite magnetic material having a sheet shape having a thickness of 100 μm was obtained. From the scanning electron microscope (SEM) images of the resultant composite magnetic material after being cut, it was confirmed that the zirconia particles serving as the insulating particles were distributed so that the number of the zirconia particles was one or more per a length of 0.2 μm of the surface of the soft magnetic metal powder in a cross section of the soft magnetic metal powder in a thickness direction. The composite magnetic material having a sheet shape had a surface resistance of $1.5 \times 10^5 \Omega$ and a sheet density of 3.8 g/cc.

Comparative Example 1

A composite magnetic material having a sheet shape having a thickness of 100 μm was obtained in the same manner as in Example 1 except that the soft magnetic metal powder having a flat shape was not coated with the insulating particles. The composite magnetic material having a sheet shape had a surface resistance of $2.5 \times 10^1 \Omega$ and a sheet density of 4.3 g/cc.

The composite magnetic materials having a sheet shape of Example 1 and Comparative Example 1 were each punched into a toroidal shape measuring 7.9 mm in outer diameter, 3.05 mm in inner diameter, and 100 μm in thickness, and measured for in-plane magnetic permeability with an impedance/material analyzer E4991A (Agilent Technologies) and a magnetic material measurement fixture 16454A (Agilent Technologies). A flat μ' value with respect to frequency was 18 in Example 1 and 24 in Comparative Example 1. Comparative Example 1 had a configuration in which a distance between the soft magnetic metal powders was smaller than that in Example 1, and hence their magnetic bonding was strengthened, with the result that a value for the magnetic permeability was high in Comparative Example 1. However, the surface resistance was as extremely low as $2.5 \times 10^1 \Omega$, resulting in insufficient insulation properties. Meanwhile, in Example 1, the surface resistance was as high as $1.5 \times 10^5 \Omega$, and a reduction in magnetic permeability was able to be suppressed to about 18.

Figure 3A:
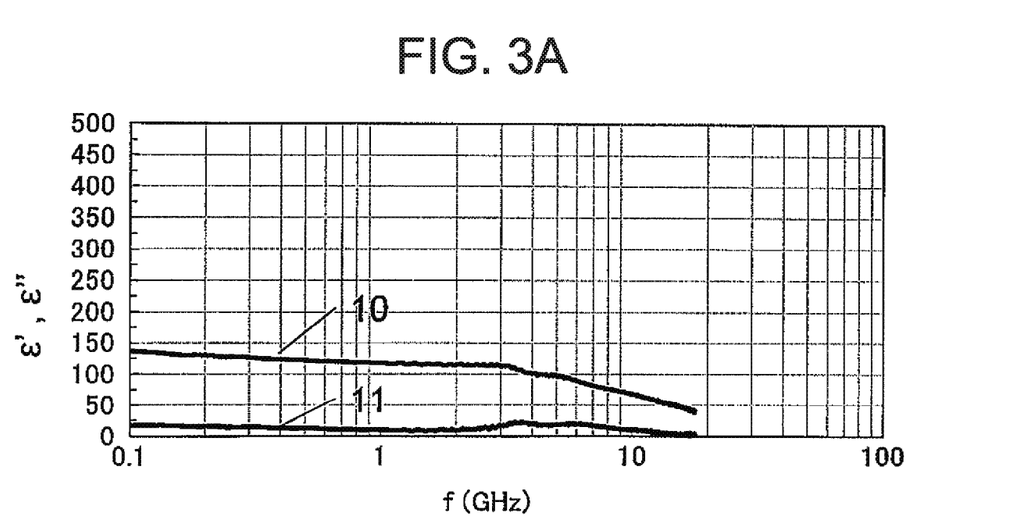
FIG. 3A is a graph for showing frequency response of a dielectric constant of a composite magnetic material of Example 1.
Figure 3B:
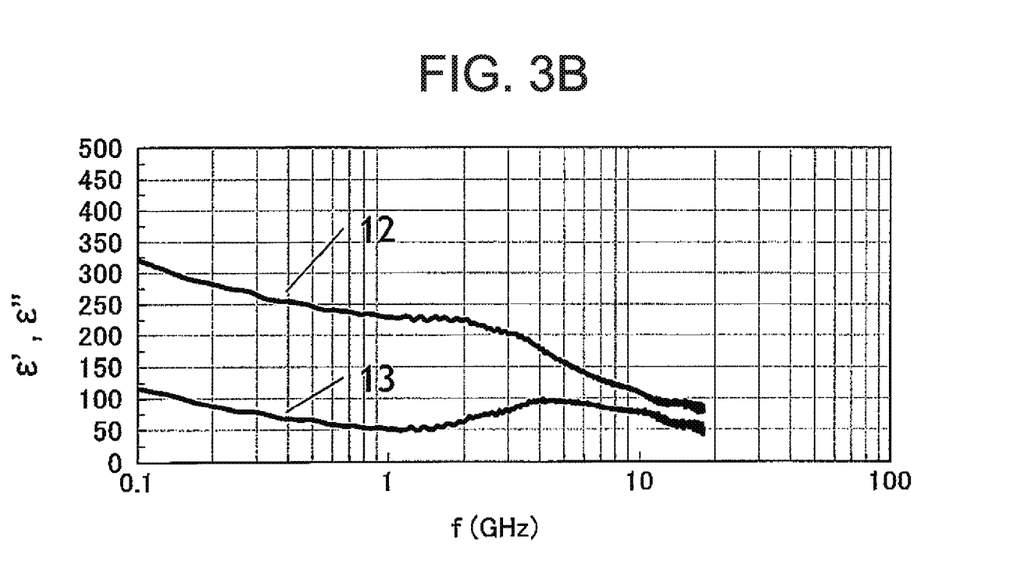
FIG. 3B is a graph for showing frequency response of a dielectric constant of a composite magnetic material of Comparative Example 1.

The composite magnetic materials having a sheet shape of Example 1 and Comparative Example 1 were each punched into a toroidal shape measuring 7.00 mm in outer diameter, 3.05 mm in inner diameter, and 100 μm in thickness, and measured for in-plane dielectric constant with a network analyzer ENA E5080A (Keysight Technologies) and a transmission line method coaxial sample holder CSH2-APC7 (Kanto Electronic Application and Development Inc.). The results are shown in FIGS. 3A and 3B. In Example 1, a value for ε'10 and a value for ε"11 at 0.1 GHz were 137 and 17, respectively. In Comparative Example 1, a value for ε'12 and a value for ε"13 at 0.1 GHz were 320 and 116, respectively. It was confirmed that both ε' and ε" in Example 1 were lower than those in Comparative Example 1.

Figure 4:
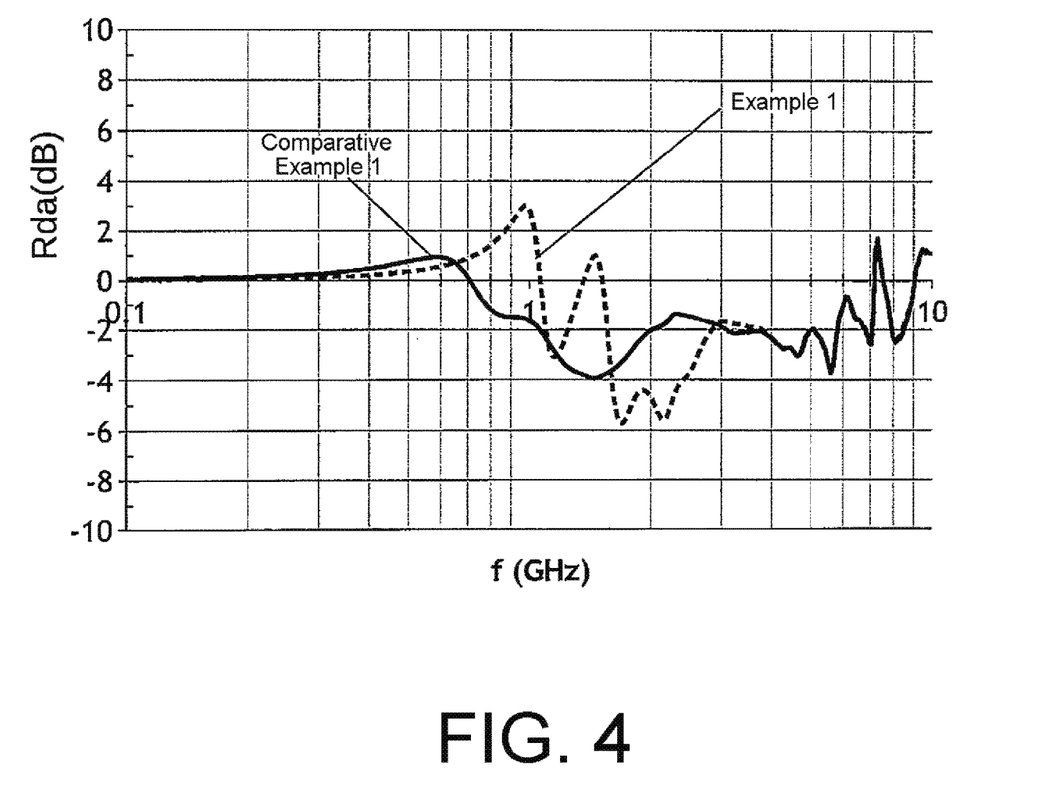
FIG. 4 is a graph for showing frequency response of an Rda of the composite magnetic material according to this invention.

The composite magnetic materials having a sheet shape of Example 1 and Comparative Example 1 were each cut into a sheet measuring 40 mm in length, 40 mm in width, and 100 μm in thickness, and measured by a method specified in International Electrotechnical Commission Standard IEC 62333-2. The results are shown in FIG. 4. In Example 1, an Rda (Intra-decoupling ratio) was more than 0 up to 1.1 GHz, and in Comparative Example 1, an Rda was more than 0 up to 0.7 GHz. It was confirmed that a frequency band in which decoupling occurred was extended in the case of the composite magnetic material of Example 1 as compared to the case of the composite magnetic material of Comparative Example 1.

Next, the characteristics of the composite magnetic materials having a sheet shape of Example 1 and Comparative Example 1 are described in detail.

Figure 5A:
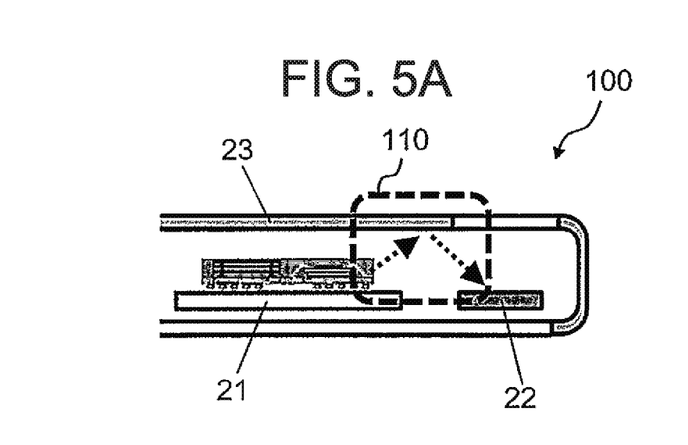
FIG. 5A is a schematic view for illustrating a cross section of an internal structure of a communication device 100.

FIG. 5A is a schematic view for illustrating a cross section of an internal structure of a communication device 100, such as a cellular phone, to which each of the composite magnetic materials having a sheet shape of Example 1 and Comparative Example 1 is to be applied. As illustrated in FIG. 5A, the communication device 100 includes an electronic component 21, an antenna 22, and a metal housing 23.

Herein, in the communication device 100, the electronic component 21 is a noise source which generates noise. In this case, the noise generated from the electronic component 21 interferes with the antenna 22 through intermediation of the metal housing 23 in a reflection region 110. As a method of suppressing such noise, a method involving bonding a magnetic sheet to the metal housing 23 in an inside of the communication device 100, to thereby suppress noise, has been known.

Figure 5B:
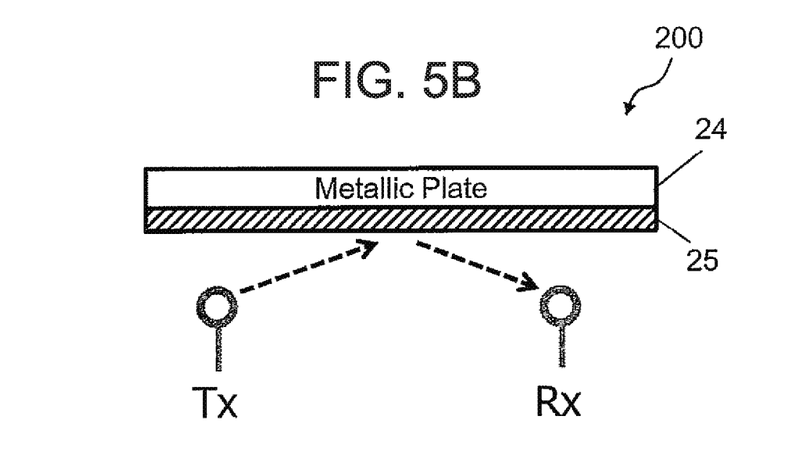
FIG. 5B is a schematic view for illustrating an evaluation system 200 in which the communication device 100 is modeled.

FIG. 5B is a schematic view for illustrating an evaluation system 200 in which the internal structure of the communication device 100 illustrated in FIG. 5A is modeled. The evaluation system 200 includes a noise source Tx, an antenna Rx, a metal plate 24, and a magnetic sheet 25. Herein, the noise source Tx corresponds to the electronic component 21 in FIG. 5A. The antenna Rx corresponds to the antenna 22 in FIG. 5A. The metal plate 24 corresponds to the metal housing 23 in FIG. 5A.

The magnetic sheet 25 is bonded to the surface of the metal plate 24. In this case, noise generated from the noise source Tx interferes with the antenna Rx through intermediation of the magnetic sheet 25 bonded onto the metal plate 24.

The frequency responses of decoupling in the cases of using the above-mentioned composite magnetic materials having a sheet shape of Example 1 and Comparative Example 1 as the magnetic sheet 25 in the evaluation system 200 were compared to each other. Specifically, in a frequency region of from 0 GHz to 9 GHz, a coupling attenuation amount between the noise source Tx and the antenna Rx was confirmed.

Figure 6:
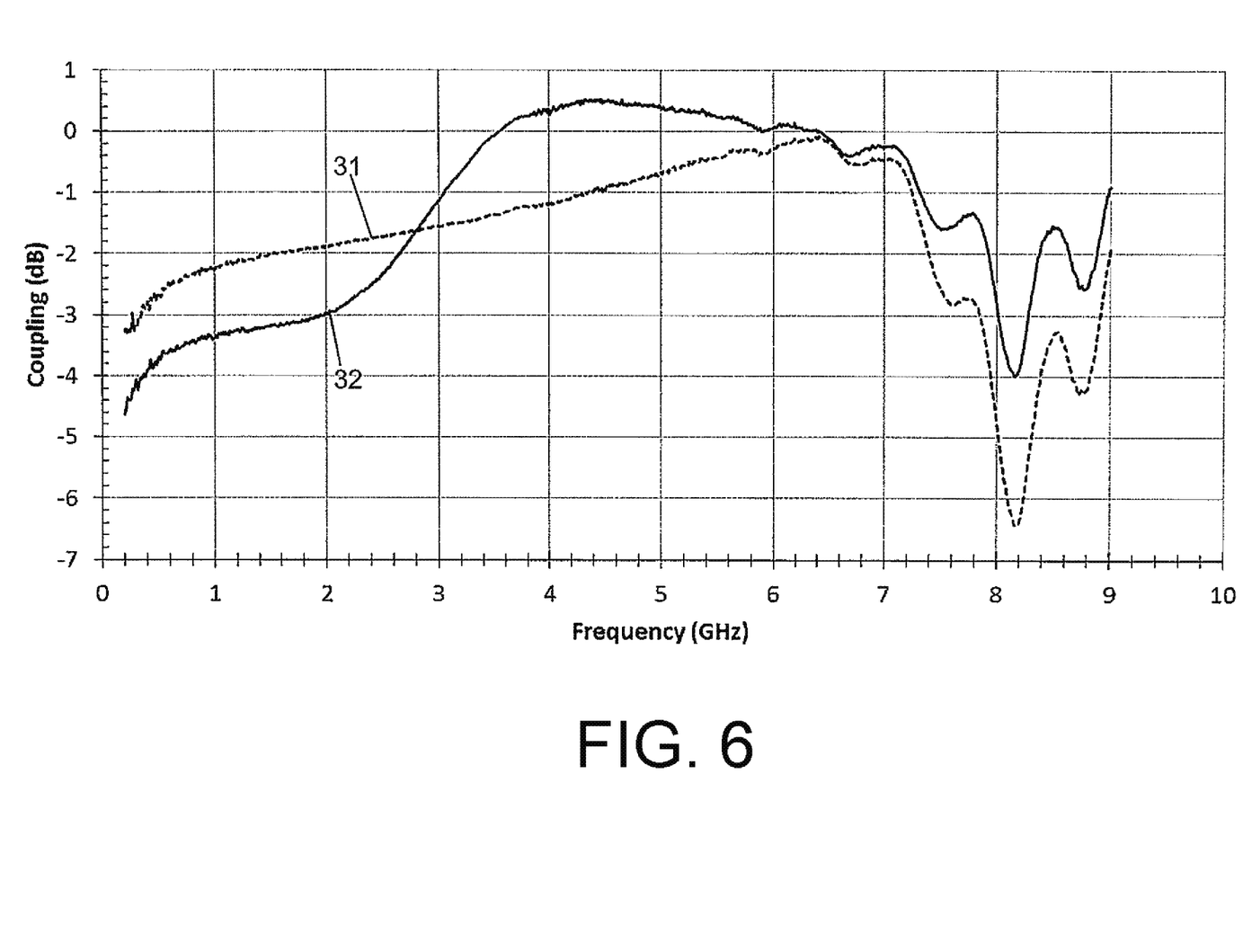
FIG. 6 is a graph for showing frequency response of decoupling in Example 1 and Comparative Example 1.

FIG. 6 is a graph for showing frequency response of decoupling in Example 1 and Comparative Example 1 in the evaluation system 200. Specifically, in FIG. 6, the abscissa represents frequency (GHz) and the ordinate represents coupling (dB) between the noise source Tx and the antenna Rx. In FIG. 6, first frequency response 31 is frequency response in Example 1, and second frequency response 32 is frequency response in Comparative Example 1.

With reference to FIG. 6, as shown by the first frequency response 31, it is revealed that, in Example 1, decoupling occurs in the entire frequency region of from 0 GHz to 9 GHz. Meanwhile, as shown by the second frequency response 32, in Comparative Example 1, coupling of noise occurs in a frequency region of from 3.6 GHz to 6.2 GHz.

Specifically, coupling in Example 1 in the evaluation system 200 was less than 0 in the measured range of up to 9 GHz, but coupling in Comparative Example 1 in the evaluation system 200 was less than 0 up to 3.5 GHz. That is, in the evaluation system 200, the composite magnetic material of Example 1 allows a frequency band in which decoupling occurs to cover higher frequency than the composite magnetic material of Comparative Example 1.

Accordingly, as shown in FIG. 6, it was confirmed that the composite magnetic material of Example 1 was able to satisfactorily cause decoupling as compared to the composite magnetic material of Comparative Example 1.

REFERENCE SIGNS LIST 1 soft magnetic metal powder
2 insulating particle
3 organic binder
10, 12 ε'
11, 13 ε"
21 electronic component
22 antenna
23 metal housing
24 metal plate
25 magnetic sheet
31 first frequency response
32 second frequency response
100 communication device
110 reflection region
200 evaluation system

The invention claimed is:
1. A composite magnetic material comprising:
soft magnetic metal powder having a flat shape;
insulating particles distributed on a surface of the soft magnetic metal powder by drying an aqueous solvent, the insulating particles each having a size smaller than an average thickness of the soft magnetic metal powder; and
an organic binder configured to retain the soft magnetic metal powder and the insulating particles in a dispersed manner,
wherein the insulating particles and the organic binder are distributed between layers of the soft magnetic metal powder so that a number of the insulating particles is at least one per a length of 0.2 μm of the surface of the soft magnetic metal powder in a cross section of the soft magnetic metal powder in a thickness direction and so that the surface of the soft magnetic metal powder is completely and uniformly coated with the insulating particles and the binder,
wherein $(Sz/2)/Sp=n$ is satisfied, where Sp represents a specific surface area of the soft magnetic metal powder, Sz represents a specific surface area of the insulating particles, n represents a number of laminated layers of the insulating particles, and n is one, and wherein the soft magnetic metal powder has a 10% cumulative particle diameter $D_{10}$ of at least 2 μm and at most 6 μm and a 90% cumulative particle diameter $D_{90}$ of at least 8 μm and at most 27 μm in a volume-based particle size distribution.

2. The composite magnetic material according to claim 1, wherein the insulating particles each comprise at least one kind of alumina, silica, magnesia, titania, or zirconia.

3. The composite magnetic material according to claim 1, wherein the insulating particles each have a volume resistivity of at least $1 \times 10^{13}$ Ω·cm.

4. The composite magnetic material according to claim 1, wherein the insulating particles have a median diameter $D_{50}$ of at least 10 nm and at most 70 nm in a volume-based particle size distribution.

5. A method of producing a composite magnetic material, the method comprising:

immersing soft magnetic metal powder having a flat shape in a sol which is obtained by dispersing insulating particles each having a size smaller than an average thickness of the soft magnetic metal powder in an aqueous solvent and has a pH of more than 7.0, followed by drying the aqueous solvent to coat a surface of the soft magnetic metal powder with the insulating particles;

kneading the soft magnetic metal powder with an organic binder to cause the soft magnetic metal powder to be dispersed therein; and forming the resultant into a sheet shape such that the insulating particles and the organic binder are distributed between layers of the soft magnetic metal powder so that a number of the insulating particles is at least one per a length of 0.2 μm of the surface of the soft magnetic metal powder in a cross section of the soft magnetic metal powder in a thickness direction and so that the surface of the soft magnetic metal powder is completely and uniformly coated with the insulating particles and the binder, wherein a blending ratio of the soft magnetic metal powder and the insulating particles is set such that $(Sz/2)/Sp=n$ is satisfied, where Sp represents a specific surface area of the soft magnetic metal powder, Sz represents a specific surface area of the insulating particles, n represents the number of laminated layers of the insulating particles, and n is one, and wherein the soft magnetic metal powder has a 10% cumulative particle diameter $D_{10}$ of at least 2 μm and at most 6 μm and a 90% cumulative particle diameter $D_{90}$ of at least 8 μm and at most 27 μm in a volume-based particle size distribution.

* * * * *